United States Patent [19]

Gladstone

[11] 3,983,493

[45] Sept. 28, 1976

[54] DIGITAL SYMMETRIC WAVEFORM SYNTHESIZER

[75] Inventor: Jerry M. Gladstone, Santa Rosa, Calif.

[73] Assignee: GTE Laboratories Incorporated, Waltham, Mass.

[22] Filed: June 27, 1975

[21] Appl. No.: 590,991

[52] U.S. Cl. .............................. 328/14; 307/223 C; 307/261; 328/27; 328/37; 235/150.53
[51] Int. Cl.² ................. H03K 23/08; H03K 14/02; G11C 19/28; G06G 7/28
[58] Field of Search ............ 307/223 R, 223 C, 261, 307/260, 221 R, 221 C; 328/14, 27, 37, 48; 235/150.53

[56] References Cited
UNITED STATES PATENTS

| | | |
|---|---|---|
| 3,500,215 | 3/1970 | Leuthold et al. ............ 307/221 D X |
| 3,513,329 | 5/1970 | Washizuka et al. .............. 307/223 C |
| 3,626,076 | 12/1971 | Uchiyama ......................... 328/14 X |

FOREIGN PATENTS OR APPLICATIONS

| | | |
|---|---|---|
| 1,194,899 | 6/1965 | Germany .............................. 328/14 |

Primary Examiner—John S. Heyman
Assistant Examiner—Larry N. Anagnos
Attorney, Agent, or Firm—Irving M. Kriegsman; Leslie J. Hart

[57] ABSTRACT

A waveform synthesizer for generating analog waveforms is provided utilizing all MOSFET integrated circuit logic. The synthesizer includes an $n$ stage clocked shift register in which the input to the first shift register stage is the inverted output of the last shift register stage. The output of each stage controls the state of a preselected weighting unit field effect transistor which provides a preselected output whenever the corresponding shift register stage is a logic 1. The outputs of all the weighting unit transistors are summed and applied to a summing field effect transistor.

5 Claims, 5 Drawing Figures

DIGITAL SYMMETRIC WAVEFORM SYNTHESIZER

BACKGROUND OF THE INVENTION

The present invention relates to the art of analog waveform generators and, more specifically, to an analog waveform generator which is designed from digital circuitry. Analog waveform generators, particularly those generating symmetrical analog waveforms, are commonly used in electrical circuits. The sine wave is the most commonly used symmetric waveform in electrical equipment; this waveform is usually generated by rotating machinery, by resonance between capacitive and inductive circuit elements or by some form of frequency selective feedback circuit. With the increased use of digital circuits, the generation of sine waves by removing the harmonics from a square wave has also found some favor. A second digital system which has been used to generate sine waves is to sequentially access a sine "look up" table and to apply the output to a digital-to-analog converter.

All of these methods require the use of either high precision RC or LC components, complex filter networks or complex digital and analog systems.

To the knowledge of the inventor herein, no analog waveform generator of the type described and claimed herein is known.

SUMMARY OF THE INVENTION

It is an object of the present invention to provide an analog waveform generator utilizing digital logic circuitry.

It is another object of the present invention to provide a digitized waveform generator utilizing all MOS field effect transistors.

It is another object of the present invention to provide a symmetric waveform generator that is an all digital, MOS field effect transistor integrated circuit system that generates a digital proximation to any symmetric waveform over a wide frequency range.

According to the present invention, a symmetric waveform generator is provided which includes a shift register and a weighting network. The shift register employs a multiplicity of static clock shift register stages connected in series to form an $n$ stage shift register. The output of the last stage is coupled to the input of the first stage through an inverter. A weighting MOS transistor unit is connected to the output of each shift register stage. The weighting unit is preferably a custom designed MOS field effect transistor that is being used to control a predetermined amount of current. The current flow through each weighting unit is turned on or off by a switching transistor which is controlled by the output of the corresponding shift register stage. The output of all of the waveform weighting units are summed by a summing field effect transistor to provide an output voltage whose magnitude is proportional to the instantaneous weighted count in the combined $n$ stages of the shift register.

DESCRIPTION OF THE PREFERRED EMBODIMENTS

Figure 1:
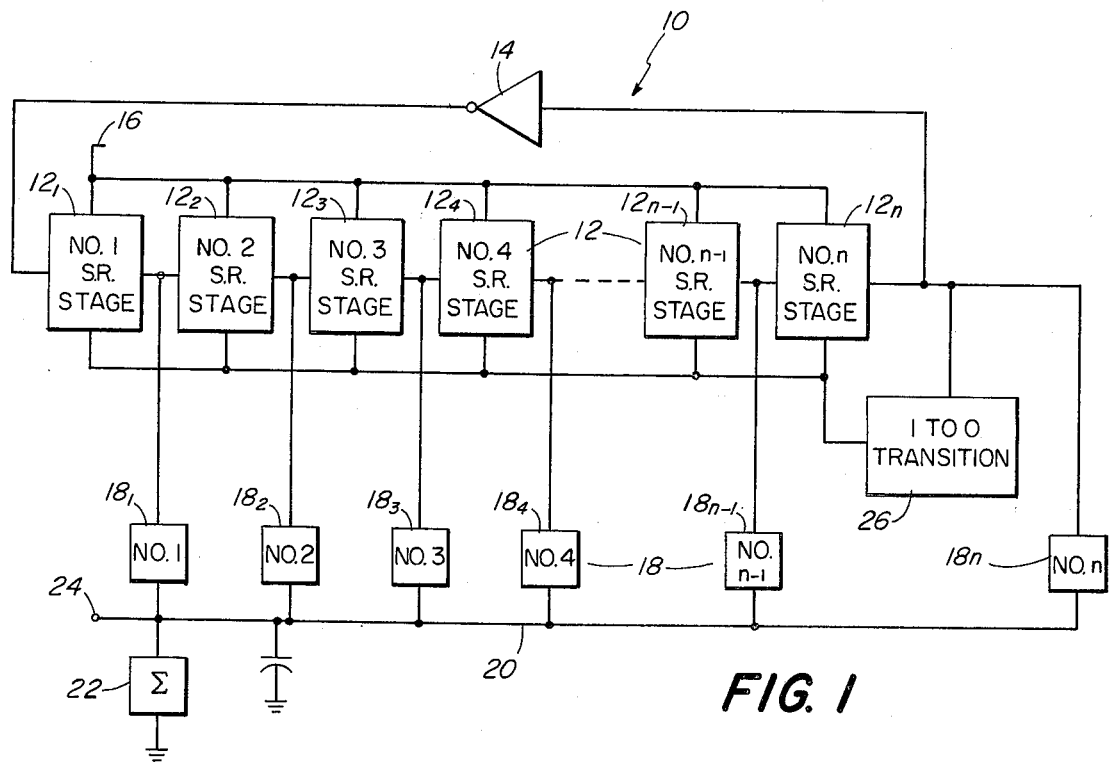
FIG. 1 is a block diagram of a digital symmetric waveform synthesizer according to the present invention.

In an exemplary embodiment of the present invention, as shown in FIG. 1, a generator, represented generally by the reference numeral 10, is provided for producing analog waveforms. The generator uses digital logic circuitry for producing the analog waveform. The generator 10 includes $n$ stage clocked shift register 12, the individual stages being represented by the reference numeral $12_1$ through $12_n$. The logical output of the last shift register stage $12_n$ is coupled to an inverter 14 whose output is coupled to the input of the first shift register stage $12_1$. A clock input 16 is applied to each of the shift register stages so that the logic level of any stage is shifted to the stage to its right within the period of the clock pulse.

The output of each shift register stage is coupled to a weighting network represented generally by the reference numeral 18. There are provided $n$ weighting networks, designated $18_1$ to $18_n$. The purpose of each weighting network is to generate in response to one of the two logic levels an output current which is some preselected relation to the logic level. The output currents from all the units are summed. The total current carried by a conductor 20 is applied to an MOS summing transistor 22 which develops an output voltage at 24 which is the output of the generator 10. Preferably, the generator 10 includes a logic 1 to logic 0 transition circuit 26 which receives the output of stage $12_n$ and resets each of the $n$ stages when the output of stage $12_n$ goes from a logic 1 to a logic 0. This logic 26 provides a means for error checking.

The following is a more detailed operational description of a waveform generator according to the invention. At the output of each shift register stage is a weighting unit. The weighting unit is essentially a custom designed MOS field-effect-transistor that is being used to generate a certain numerical value. The principle at work here is that the weighting-unit MOS transistor governs the amount of current flow through itself if the output of its corresponding shift register stage is a 1; on the other hand, if the stage output is a logic 0, there is no current flow. The current from all weighting units is summed and appears as a voltage across the output-unit MOS transistor. In tracing the operation of the generator, assume initially that the output of each of the $n$ shift register stages is a logic 0. When the proper clock pulse appears, the registers shift their information to the next register in sequence. The $n$th shift register has its logic 0 inverted to a logic 1 by the inverter 14, thereby giving stage 1 a logic 1 as its output. With this code in the shift register, i.e. 1,0,0 . . . , 0, only weighting unit 1 contributes currents to the output, thereby giving the first step in the digital approximation to the desired output waveform. Upon the next clock pulse the shift register 12 has the code: (1,1,0,0 . . . , 0). Thus weight units numbers 1 and 2 contribute the currents that add to form the output voltage step desired across the summing transistor 22. This process continues until all 1's are in the register 12 thus creating an output proportional to the sum of all the weighting units. When the next clock pulse occurs the 1 in the $n$th shift register stage becomes a 0 and is transferred into stage number 1. This information in the shift register is then $(0,1,1,\ldots,1)$ thus effectively subtracting the current contribution of weighting unit number 1 from the total. This process continues until all 0's are present, thus returning the system to the starting condition.

The weighting units for symmetrical wave generation must be symmetrical about the centerline of the system. That is, weighting unit number 1 must be the same as weighting unit number $n$. Thus, the waveform generated will look like the waveform illustrated in FIG. 3.

Figure 2:
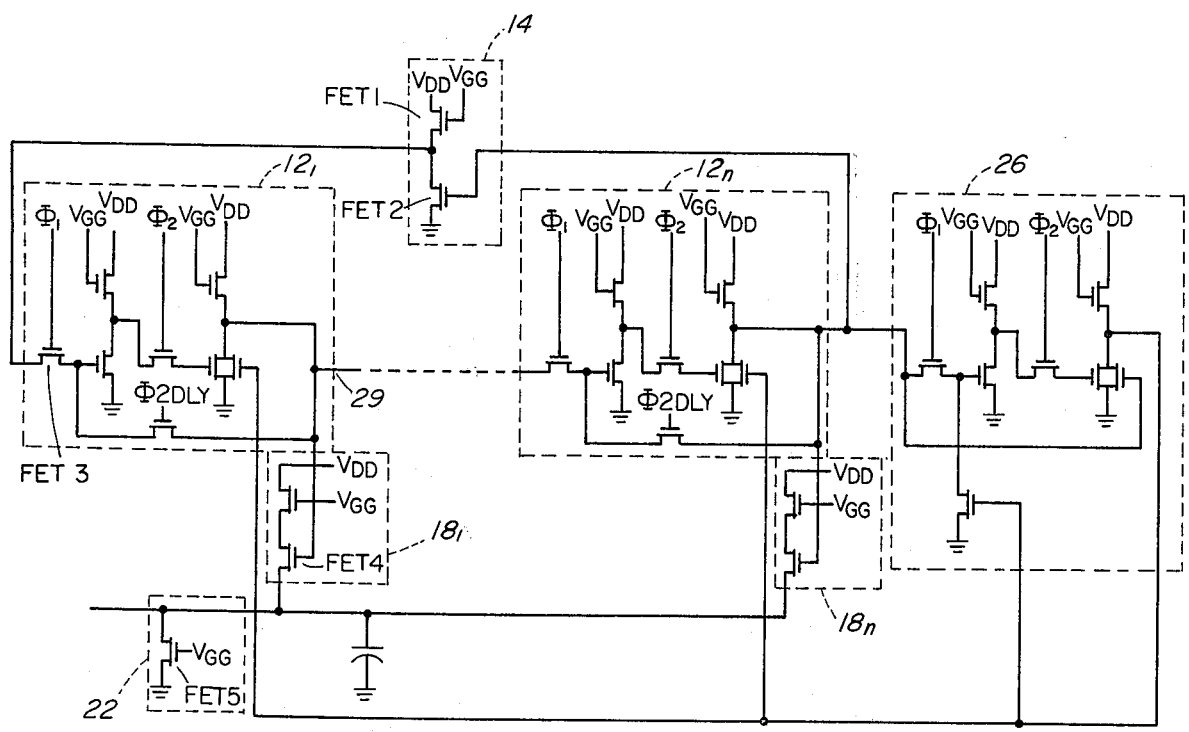
FIG. 2 is a circuit diagram of the digital symmetric waveform synthesizer of FIG. 1.

Referring now to FIG. 2, there is provided a schematic diagram for the various components of the block diagram in FIG. 1. The shift register stages 12, the weighting units 18, the inverter 14 and the 1 to 0 transistor logic all use field effect transistorized circuitry. This permits the generator to be designed as a single, small chip, thereby facilitating its use in small areas, such as in a telephone hand set for generating the telephone tone frequencies. The inverter 14 includes FET 1 and 2 and with the bias voltages $V_{DD}$ and $V_{GG}$ creates a logic inversion between the gate electrode of FET 2 and the drain electrode of FET 2. The $n$ shift register stages are all identical in design. The clock input is designed as the inputs $\phi_1$, $\phi_2$ and $\phi_{2DLY}$ which are all generated by the same clock (not shown). These signals comprise alternating clock pulses for clocked ratio logic. The details of the operation are within the skill of those skilled in the art. The net operational effect is that the logic input to FET 3 is transferred to the output 29 within the next occurence of the clock pulses.

Each weighting MOS transistor unit 18 is connected to the output 29 of each shift register stage 12. The weighting unit is essentially a custom designed MOS field-effect-transistor that is being used to control a predetermined amount of current. For a sine-wave output the amount of current to be contributed by each weighting unit is given by:

$$I_n \alpha\ 2\ \text{Sin}\ \frac{\pi}{N} \cdot \text{Sin}\ \frac{\pi}{N}(2n-1) \quad (1)$$

where
$N = $ the number of divisions per cycle that the sine-wave is divided into; and
$n = $ the number of the weighting unit (step).

The current flow through each weighting unit is turned on or off by a switching transistor FET 4 which is controlled by the output of the corresponding shift register stage. To trace the system operation assume all shift register stages are loaded with 0's. In this case no current flows through any of the weighting units and no voltage is developed across the summing unit MOS transistor FET 5. After the first shift pulse a 1 is loaded into shift register stage number 1. This will turn on weighting unit $18_1$ and a current proportional to $$2\ \text{Sin}^2\ \frac{\pi}{N}$$

is dropped across the summing unit to give a proportional output voltage. After the second shift pulse there are 1's in the first two shift register stages thus the weighting units $18_1$ and $18_2$ are turned on giving a current proportional to $$I \alpha\ 2\ \text{Sin}^2\ \frac{\pi}{N} + 2\ \text{Sin}\ \frac{\pi}{N}\ \text{Sin}^3\ \frac{\pi}{N} = \sum_{n=1}^{2}\ 2\ \text{Sin}\ \frac{\pi}{N}\text{Sin}\ \frac{\pi}{N}(2n-1) \quad (2)$$

to be dropped across the summing unit giving a proportional output voltage. In this way the output voltage is built-up until all shift register stages are loaded with 1's. This gives a current from the weighting units that is proportional to $$I \alpha\ \sum_{n=1}^{N/2}\ 2\ \text{Sin}\ \frac{\pi}{N}\text{Sin}\ \frac{\pi}{N}(2n-1) \quad (3)$$

and a corresponding output voltage.

Figure 3:
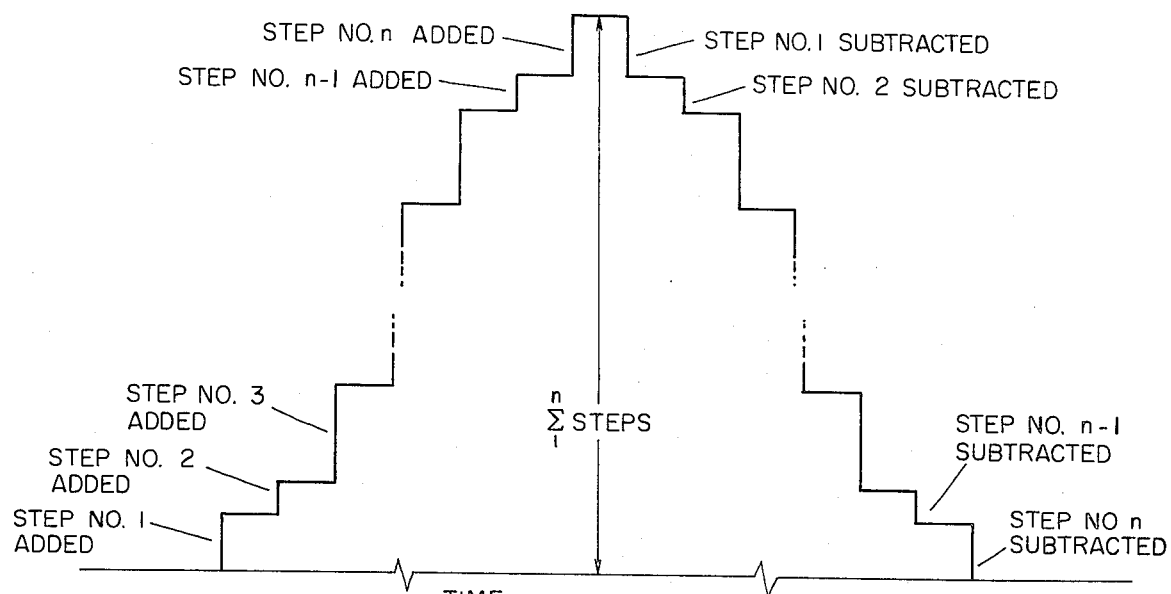
FIG. 3 is a graph illustrating the effect of the various weighting units in the waveform synthesizer.

Since the shift register counts in a Johnson code a 0 is loaded into shift register stage number 1 after the all 1's condition. This turns off weighting unit number 1 and subtracts a current proportional to $$I \alpha\ 2\ \text{Sin}^2\ \frac{\pi}{N} \quad (4)$$

from the maximum value of equation (2). Thus the output voltage is proportionately less. This process continues until all 0's are once again present in the shift register and the output voltage is zero. The process then starts again. FIG. 3 illustrates this building up principle for the general case. For the sinusoidal waveform case described, the proportional current waveform generated is $$I \alpha\ 1 - C_{os}\ \frac{2\pi}{N}(n-1) \quad (5)$$

The frequency of the synthesized waveform is equal to $1/2n$ times that of the clock frequency. The number of steps needed to build an approximate waveform is predicted by use of a modified Fourier Theory.

Figure 4:
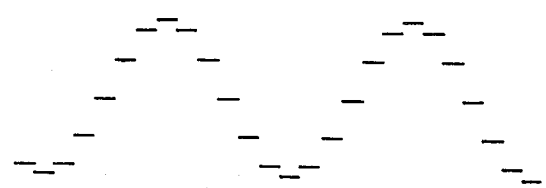
FIG. 4 is a waveform of the non-filtered output of the synthesizer arranged for sine-wave generation.
Figure 5:
FIG. 5 is a waveform of the filtered output of the sine-wave generator.

The symmetrical waveform generator of the preferred embodiment is a digital sine-wave generator used as a telephone touch-tone generator. The Fourier analysis predicted that the digital output approximation to the waveform is usually free of harmonics up to the ninth if six shift register stages are employed. Thus, $n$ is equal to 6. FIG. 4 shows the non-filtered output of the circuit in FIG. 2 and FIG. 5 shows the filtered output of the same generator.

The circuitry was designed using all MOSFET integrated circuit logic. The shift register stages utilized were of the static variety, thus enabling the symmetric waveform generator to operate from D.C. (direct current = 0 Hz) up to about 250,000 Hz.

The embodiments of the present invention are intended to be merely exemplary and those skilled in the art shall be able to make numerous variations and modifications of them without departing from the spirit and scope of the present invention. All such variations and modifications are intended to be within the scope of the present invention as defined in the appended claims.

I claim:

1. A digital generator for producing an analog waveform including:
   a. an $n$ stage clocked shift register having an inverter coupled between the output of the $n$th stage and the input of the first stage, the logic state of any stage being shifted to an adjacent stage in the direction from the first stage to the $n$th stage at a rate related to the clock signal,
   b. means responsive to a first logic level of each shift register stage for generating up to $n$ preselected weighted currents, and responsive to a second logic level of each shift register stage for generating no current,
   c. means for summing the preselected weighted currents to produce an analog voltage waveform whose shape is related to the sum of the preselected weighted output currents, and
   d. means responsive to the output of the $n$th stage for resetting each stage of the shift register to the second level when the $n$th stage changes from the first level to the second level to insure that each shift register stage at said change is at the second level.

2. The generator according to claim 1 wherein the generating means associated with each shift register stage includes a first MOS field effect transistor whose gate is coupled to the output of the respective shift register stage to permit the preselected current flow therethrough when the output of the stage has the first logic level and to permit no current when the output of the stage has the second logic level and a second MOS field effect transistor having a gate and drain coupled to separate constant voltage sources and having its source coupled to one of the source and drain electrodes of the first transistor for providing the preselected current when the first transistor is conductive, the output of the generating means being taken from the other of the source and drain electrodes of the first transistor.

3. The generator according to claim 2 wherein the summing means includes an output conductor connecting the outputs of all of the first MOS field effect transistors and a summing field effect transistor for generating a voltage proportional to the sum of currents and further including means for filtering the output voltage.

4. The generator according to claim 3 wherein the second MOS field effect transistors are selected to provide symmetrical preselected currents with respect to the center of the shift register and further to provide a sinusoidal waveform.

5. The generator according to claim 4 wherein the first level is a logic 1.

* * * * *